(12) United States Patent
Carlson et al.

(10) Patent No.: US 6,937,053 B2
(45) Date of Patent: Aug. 30, 2005

(54) SINGLE EVENT HARDENING OF NULL CONVENTION LOGIC CIRCUITS

(75) Inventors: Roy M. Carlson, Plymouth, MN (US); David O. Erstad, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 107 days.

(21) Appl. No.: 10/463,794

(22) Filed: Jun. 17, 2003

(65) Prior Publication Data

US 2004/0257108 A1 Dec. 23, 2004

(51) Int. Cl.⁷ ............................................. H03K 19/007
(52) U.S. Cl. .......................... 326/14; 326/121; 326/93
(58) Field of Search ........................... 326/121, 14, 38, 326/93, 39

(56) References Cited

U.S. PATENT DOCUMENTS

| | | | |
|---|---|---|---|
| 4,782,467 A | 11/1988 | Belt et al. .................... | 365/154 |
| 4,805,148 A | 2/1989 | Diehl-Nagle et al. ........ | 365/154 |
| 5,305,463 A | 4/1994 | Fant et al. .................... | 395/800 |
| 5,382,844 A * | 1/1995 | Knauer .......................... | 326/95 |
| 5,406,513 A | 4/1995 | Canaris et al. ............... | 365/181 |
| 5,579,526 A * | 11/1996 | Watt .............................. | 396/559 |
| 5,640,105 A | 6/1997 | Sobelman et al. ............ | 326/36 |
| 5,652,902 A | 7/1997 | Fant ............................. | 395/800 |
| 5,656,948 A | 8/1997 | Sobelman et al. ............ | 326/35 |
| 5,664,211 A | 9/1997 | Sobelman et al. .......... | 395/141 |
| 5,664,212 A | 9/1997 | Fant et al. .................... | 395/141 |
| 5,764,081 A | 6/1998 | Fant et al. ..................... | 326/63 |
| 5,793,662 A * | 8/1998 | Duncan et al. ............. | 708/670 |
| 5,796,962 A | 8/1998 | Fant et al. .................... | 395/306 |
| 5,828,228 A | 10/1998 | Fant et al. ..................... | 326/35 |
| 5,896,541 A | 4/1999 | Fant et al. ............. | 395/800.1 B |
| 5,907,693 A | 5/1999 | Fant et al. ................... | 395/384 |
| 5,930,522 A | 7/1999 | Fant ....................... | 395/800.25 |
| 5,977,663 A | 11/1999 | Fant et al. ................... | 307/251 |
| 5,986,466 A | 11/1999 | Sobelman et al. ............ | 326/39 |
| 6,020,754 A | 2/2000 | Sobelman et al. ............ | 326/35 |
| 6,031,390 A | 2/2000 | Fant et al. .................... | 326/36 |
| 6,043,674 A * | 3/2000 | Sobelman ..................... | 326/35 |

(Continued)

OTHER PUBLICATIONS

Maher, Michael, "Radiation Design Considerations Using CMOS Logic," National Semiconductor Application Note 926, Jan. 1994.

"Throw Away the Clock," Theseus Logic—Benefits of NCL—EMI, http://www.theseus.com/_AboutNCL.htm, printed Nov. 19, 2002.

Sobelman, Gerald E. and Karl Fant, "CMOS Circuit Design of Threshold Gates with Hysteresis," CMOS Circuit Design of Threshold Gates with Hysteresis, no date.

Fant, Karl M. and Scott A. Brandt, "NULL Convention Logic," Theseus Logic: Setting the Standard for Clockless Systems, 1997, no month.

*Primary Examiner*—Lam T. Mai
(74) *Attorney, Agent, or Firm*—McDonnell Boehnen Hulbert & Berghoff LLP

(57) ABSTRACT

A system and method for hardening a Null Convention Logic (NCL) circuit against Single Event Upset (SEU) is presented. Placing a resistive element into a feedback loop of the NCL circuit may harden the NCL circuit. A bypass element may be placed in parallel with the resistive element to increase the latching speed of the hardened NCL circuit. Additionally, replacing transistors in an input driver, the feedback loop, and an inverter with transistor stacks, which may include two or more transistors connected in series, may harden the NCL circuit. Further, two NCL gates may be cross-coupled to harden the NCL circuit.

26 Claims, 8 Drawing Sheets

U.S. PATENT DOCUMENTS

| | | | | |
|---|---|---|---|---|
| 6,052,770 | A | 4/2000 | Fant | 712/14 |
| 6,128,678 | A | 10/2000 | Masteller | 710/52 |
| 6,262,593 | B1 * | 7/2001 | Sobelman et al. | 326/35 |
| 6,278,287 | B1 | 8/2001 | Baze | 326/9 |
| 6,292,128 | B1 | 9/2001 | Tsui et al. | 342/13 |
| 6,308,229 | B1 | 10/2001 | Masteller | 710/52 |
| 6,313,660 | B1 * | 11/2001 | Sobelman et al. | 326/39 |
| 6,326,809 | B1 | 12/2001 | Gambles et al. | 326/46 |
| 6,327,607 | B1 | 12/2001 | Fant | 709/201 |
| 6,333,640 | B1 | 12/2001 | Fant et al. | 326/35 |
| 6,526,542 | B2 | 2/2003 | Kondratyev | 716/2 |
| 6,791,362 | B1 * | 9/2004 | Carlson et al. | 326/14 |
| 2003/0091038 | A1 | 5/2003 | Hagedorn | 370/359 |

* cited by examiner

US 6,937,053 B2

1

SINGLE EVENT HARDENING OF NULL CONVENTION LOGIC CIRCUITS

FIELD

The present invention relates generally to asynchronous logic circuits, and more particularly, relates to single event hardening of null convention logic circuits.

BACKGROUND

Most digital circuits are synchronous in nature, meaning that a clock signal controls data flow through the circuit. As clock speeds increase, circuit design becomes more complex due to the timing requirements. Problems related to high clock speeds include switching noise, peak currents on power rails, and unnecessary power consumption due to the switching noise. As a result of the problems encountered with synchronous circuit design, asynchronous design techniques have received more attention.

One such asynchronous approach is null convention logic (NCL). NCL is a clock-free delay-insensitive logic design methodology for digital systems. NCL uses a combination of multi-wire data representation and a control/signaling protocol. NCL circuits switch between a data representation of DATA and a control representation of NULL. Typically, DATA corresponds to a logic-1 level, while NULL corresponds to a logic-0 level. The separation between data and control representations provides self-synchronization, without the use of a clock signal.

The use of asynchronous circuit designs, such as NCL, may be advantageous in space, weapons, and aviation applications. However, these applications expose circuits to naturally occurring radiation. Radiation may be found in the form of alpha and energetic particles, as well as in other forms, such as gamma rays. Alpha particles are the byproducts of the natural decay of elements. Energetic particles include heavy ions, protons, neutrons, and electrons, which are abundant in space, even at commercial flight altitudes.

Radiation can cause transient disturbances, or glitches, in asynchronous circuit designs. When an energetic particle strikes a transistor region, a parasitic conduction path can be created, which may cause a false transition on a node. The false transition, or glitch, can propagate through the circuit and may ultimately result in the disturbance of a node containing state information, such as an output of a latch, register, or gate. The disturbance of a state node is commonly referred to as a single even upset (SEU).

The circuit implementation of the basic NCL building block gate uses a latch element that is sensitive to upset due to transient disturbances caused by radiation. Therefore, it would be beneficial to harden an NCL circuit from the effects of SEU. As a result of hardening, NCL circuits may be used in applications in which radiation is present.

BRIEF DESCRIPTION OF THE DRAWINGS

Exemplary embodiments are described below in conjunction with the appended drawing figures, wherein like reference numerals refer to like elements in the various figures, and wherein.

2

Figure 4:
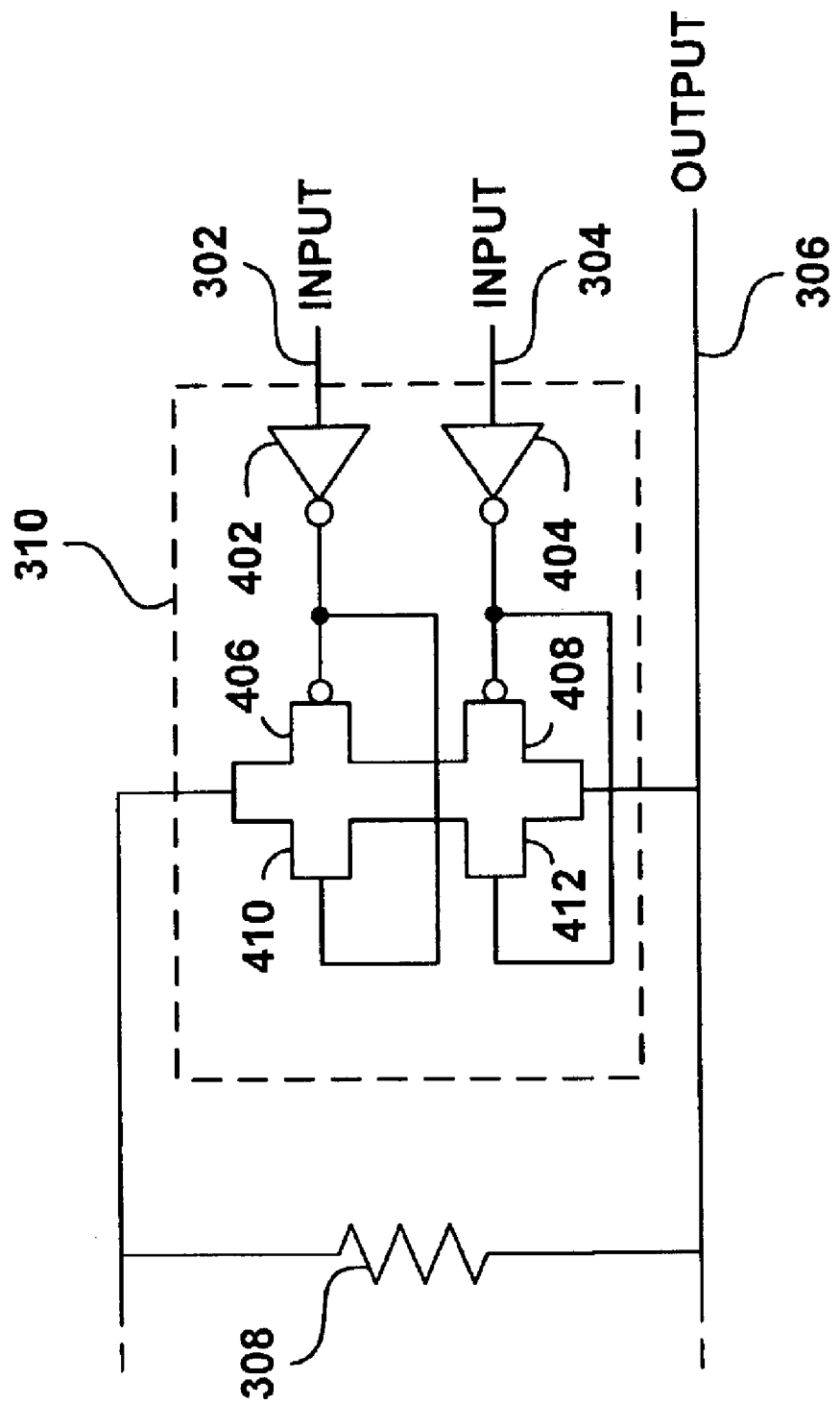
Figure 5:
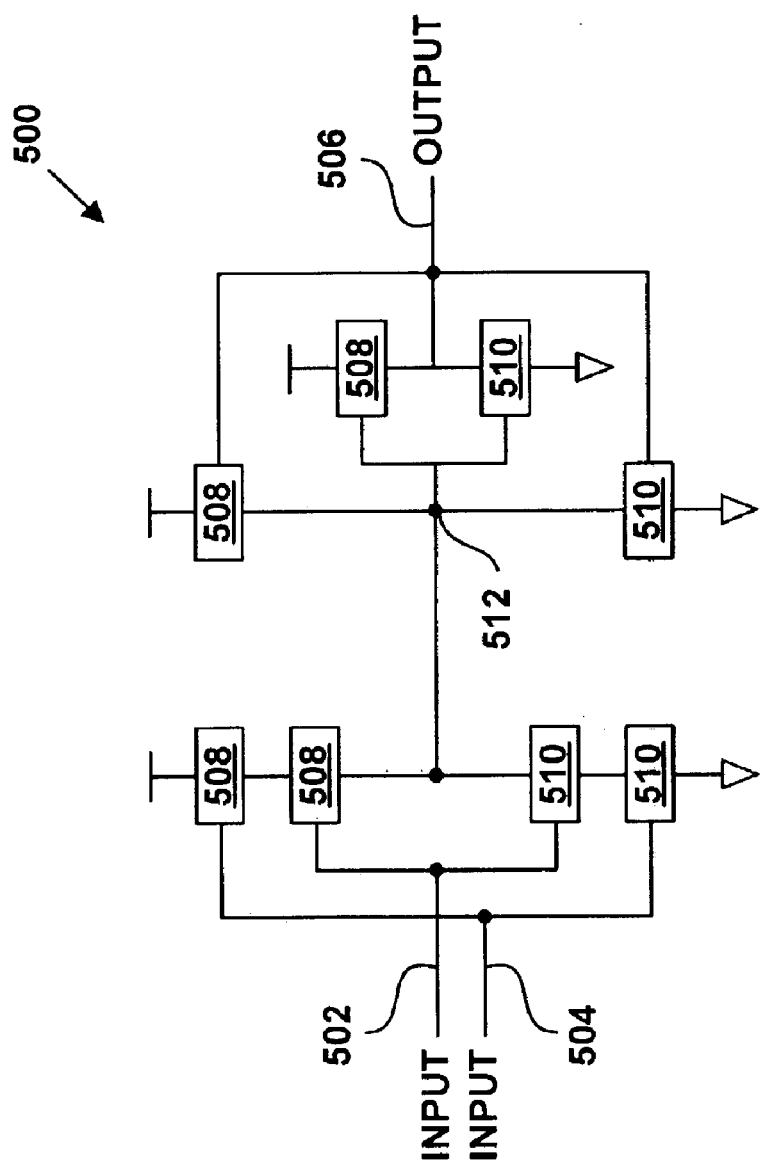
Figure 6:
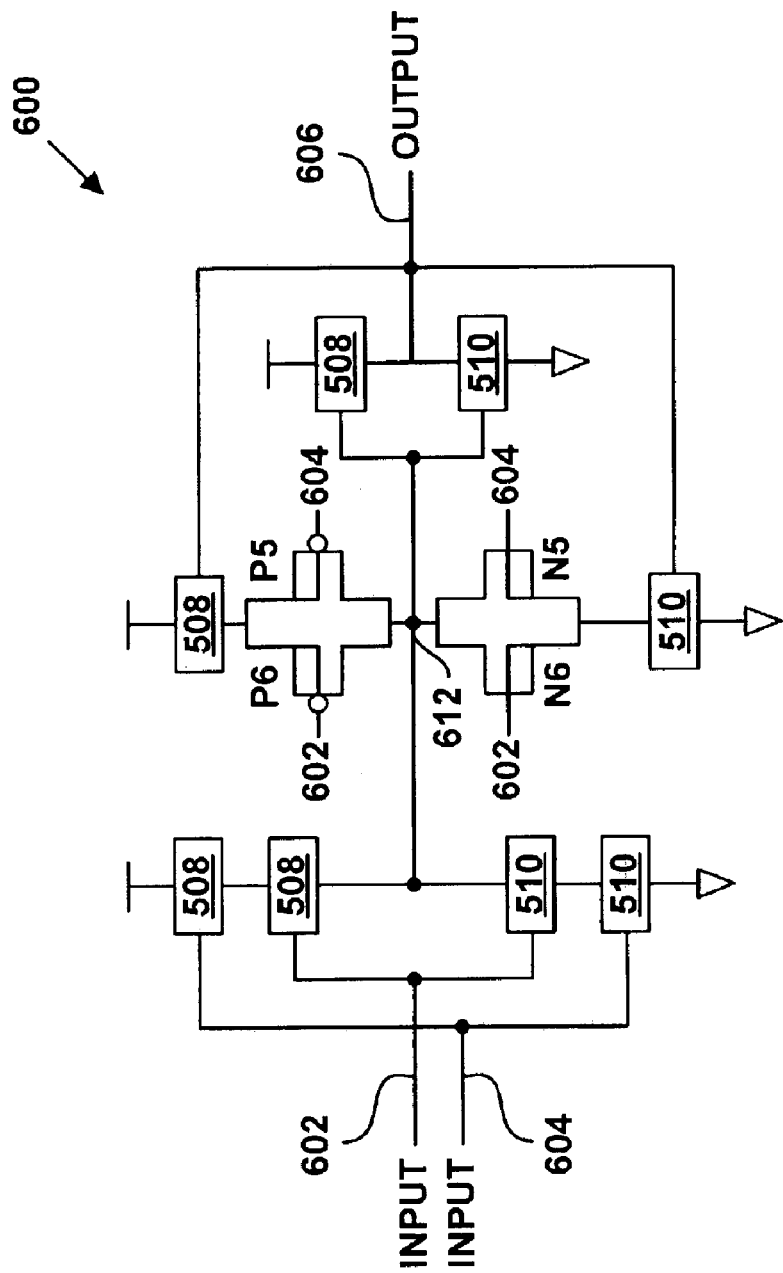
Figure 7B:
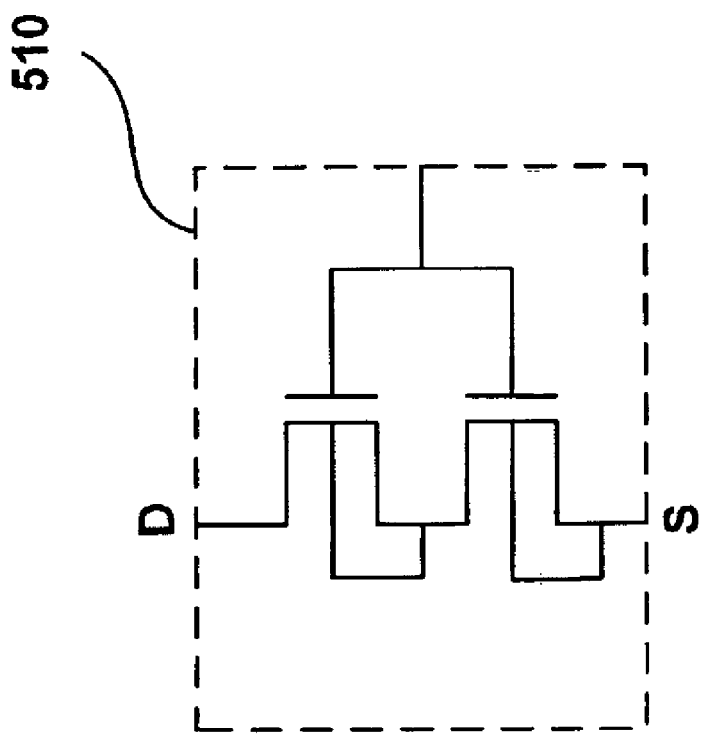
Figure 7A:
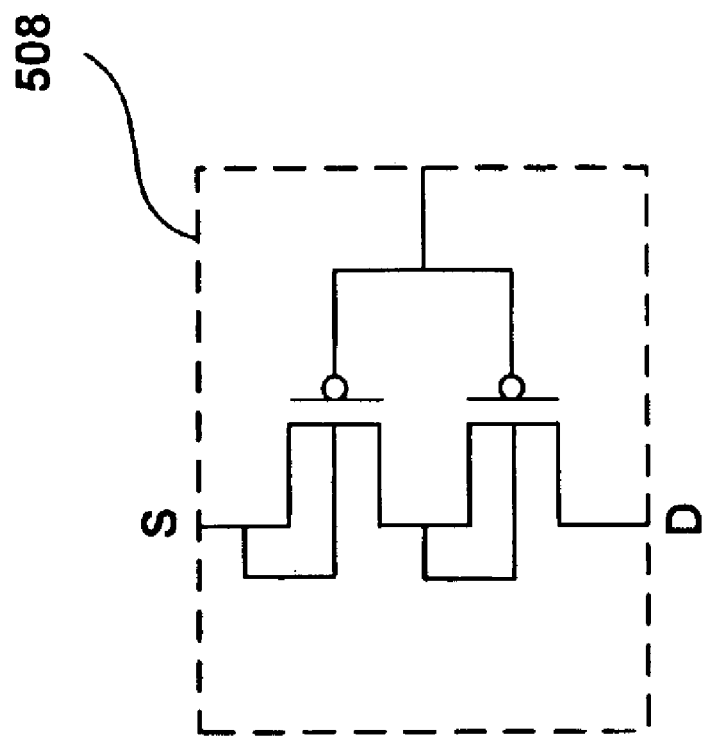
Figure 8:
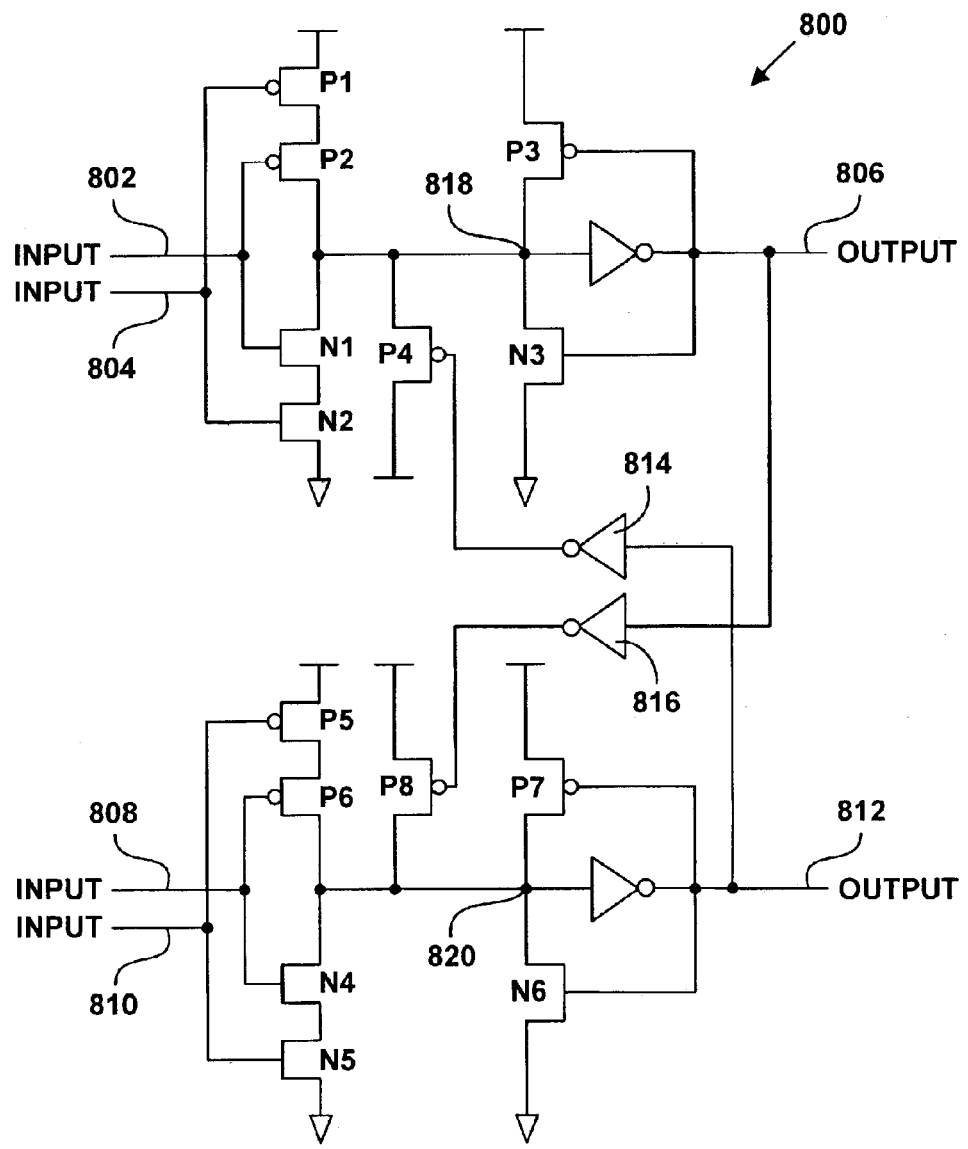

FIG. 4 is a schematic diagram of a bypass element, according to an exemplary embodiment;

FIG. 5 is a schematic diagram of a hardened NCL circuit, according to another exemplary embodiment;

FIG. 6 is a schematic diagram of a hardened NCL circuit, according to another exemplary embodiment;

FIG. 7a is a schematic diagram of a p-type transistor stack, according to an exemplary embodiment;

FIG. 7b is a schematic diagram of an n-type transistor stack, according to an exemplary embodiment; and FIG. 8 is a schematic diagram of a hardened NCL circuit, according to another exemplary embodiment.

DETAILED DESCRIPTION

Figure 1:
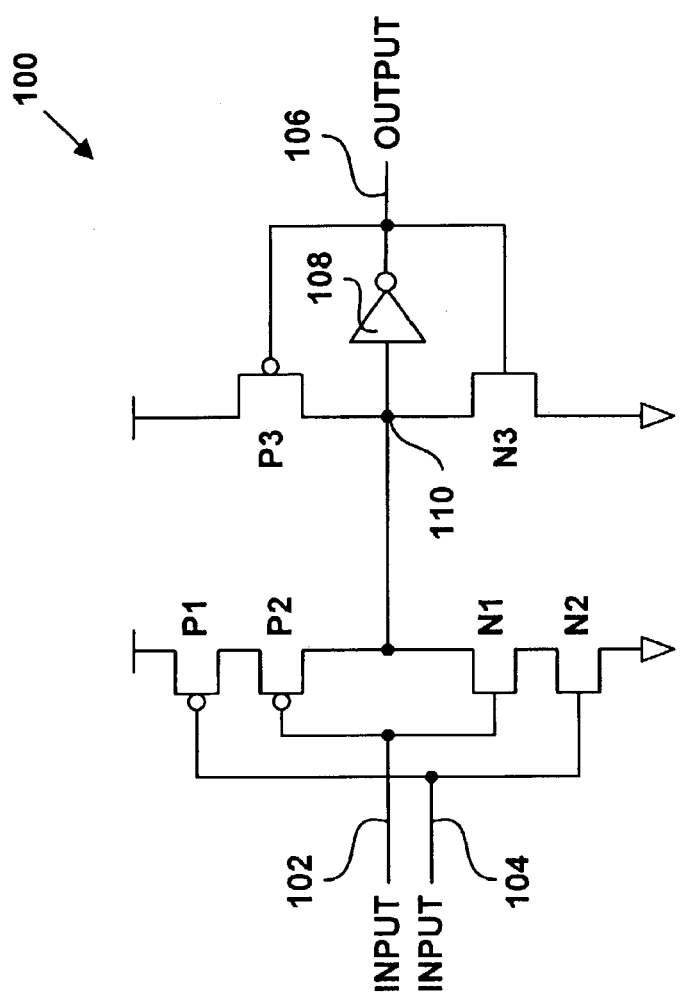
FIG. 1 is a schematic diagram of a typical NCL circuit, according to an exemplary embodiment.

FIG. 1 is a schematic diagram of a typical NCL circuit 100. The NCL circuit 100 is shown in FIG. 1 as having two inputs 102, 104. However, the NCL circuit 100 may have more than two inputs. The inputs 102, 104 can have two possible values, referred to as DATA and NULL. Typically, DATA corresponds to a logic-1 voltage level, while NULL corresponds to a logic-0 voltage level. For example, the logic-1 level may be approximately 5 volts, while the logic-0 level may be approximately 0 volts. However, other mappings of DATA and NULL are possible.

The NCL circuit 100 is shown in FIG. 1 as having a single output 106. However, the NCL circuit 100 may have more than one output. The output 106 can also have two possible values, DATA and NULL. If the output 106 is in a NULL state, then the output 106 may remain in the NULL state until a specified number of inputs are placed in the DATA state. Once the output 106 is placed in the DATA state, the output 106 may remain in this state until all of the inputs return to the NULL state.

In this example, the NCL circuit 100 has two inputs 102, 104. An output of an NCL circuit with two inputs may remain in the NULL state until both inputs are placed in the DATA state. More specifically, the output 106 may remain in the NULL state until both inputs 102, 104 are placed in the DATA state. Additionally, once the output 106 reaches the DATA state, the output 106 will remain in the DATA state until both inputs 102, 104 are placed in the NULL state.

The NCL circuit 100 also includes an input driver consisting of four transistors P1, P2, N1, and N2. Additionally, the NCL circuit 100 includes feedback transistors P3 and N3. The transistors P1, P2, P3, N1, N2, and N3 are depicted in FIG. 1 as complementary metal-oxide semiconductor (CMOS) transistors; however, other transistor types may be employed. P-type CMOS (PMOS) transistors may be used in a pull-up network (e.g., P1, P2, and P3). N-type CMOS transistors may be used in a pull-down network (e.g., N1, N2, and N3).

The NCL circuit 100 also includes an inverter 108. The inverter 108 may include a p-type transistor and an n-type transistor connected in series between power and ground. However, any combination of passive and active devices operable to convert a logic-0 input to a logic-1 output and convert a logic-1 input to a logic-0 output may be used.

The combination of the inverter 108 and the feedback transistors P3 and N3 is commonly referred to as a feedback circuit or feedback loop. The feedback loop is a self-sustaining circuit, which will maintain or latch a state and therefore function as a memory element. The gates of the P3 and N3 transistors are connected to the output of the inverter 108. As a result, the inverter 108 may turn on either P3 or N3 depending on the output of the inverter 108. For example, if the output of the inverter 108 is a logic-0, P3 may turn on. Similarly, if the output of the inverter 108 is a logic-1, N3 may turn on.

When P3 is turned on, the input to the inverter 108 may be weakly held at logic-1. When N3 is turned on, the input to the inverter 108 may be weakly held at a logic-0. The input to the inverter 108 may be described as weakly held because the impedance of the series combination of transistors N1 and N2 can overdrive P3 and pull node 110 to a logic-0 state if both inputs 102, 104 are at a logic-1. Likewise, the series combination of transistors P1 and P2 can overdrive N3 and pull node 110 to a logic-1 state in the presence of logic-0 levels on both inputs 102, 104. Accordingly, the feedback loop formed by the inverter 108, P3, and N3 may be described as a weak feedback loop. An NCL circuit having a weak feedback loop may classified as a semi-static implementation of an NCL circuit.

In comparison to the semi-static implementation of the NCL circuit shown in FIG. 1, a static implementation of an NCL circuit is shown in FIG. 6. The NCL circuit 600 in FIG. 6 includes additional components in the feedback loop. The additional transistors in the feedback loop (e.g., P5, P6, N5, and N6) serve to disconnect the feedback path when the inputs 602, 604 transition to a state in which the output 606 should change. For example, if the output 606 is at logic-0 and the inputs 602, 604 transition to a logic-1 state, then transistors P5 and P6 may turn off, breaking the feedback loop and allowing node 612 to transition to a logic-0 and the output 606 to transition to a logic-1.

Referring back to the semi-static NCL gate 100 depicted in FIG. 1, if the inputs 102, 104 are originally placed in the NULL state, the transistors P1 and P2 in the pull-up network may turn on, while the transistors N1 and N2 in the pull-down network may turn off. This may cause the output 106 to be placed in the NULL state. If either the input 102 or the input 104 is then placed in the DATA state, transistor P3 may remain turned on, which may keep the output 106 in the NULL state. However, if both the inputs 102, 104 are placed in the DATA state, the transistors P1 and P2 in the pull-up network may turn off, while the transistors N1 and N2 in the pull-down network may turn on. This may cause the output 106 to be placed in the DATA state.

If inputs 102, 104 are originally placed in the DATA state, the transistors P1 and P2 in the pull-up network may turn off, while the transistors N1 and N2 in the pull-down network may turn on. This may cause the output 106 to be placed in the DATA state. If either the input 102 or the input 104 is then placed in the NULL state, transistor N3 may remain turned on, which may keep the output 106 in the DATA state. However, if both the inputs 102, 104 are placed in the NULL state, the transistors P1 and P2 in the pull-up network may turn on, while the transistors N1 and N2 in the pull-down network may turn off. This may cause the output 106 to be placed in the NULL state.

If the NCL circuit 100 is used in applications that expose the circuit to radiation, the radiation may cause single effect upset (SEU). SEU may cause the output 106 to be placed in a NULL or DATA state independently from the intended circuit operation according to the inputs 102, 104. As a result, erroneous data may propagate through a circuit that receives data from the NCL circuit 100. Therefore, it would be beneficial to harden the NCL circuit 100 from the effects of radiation.

Figure 2:
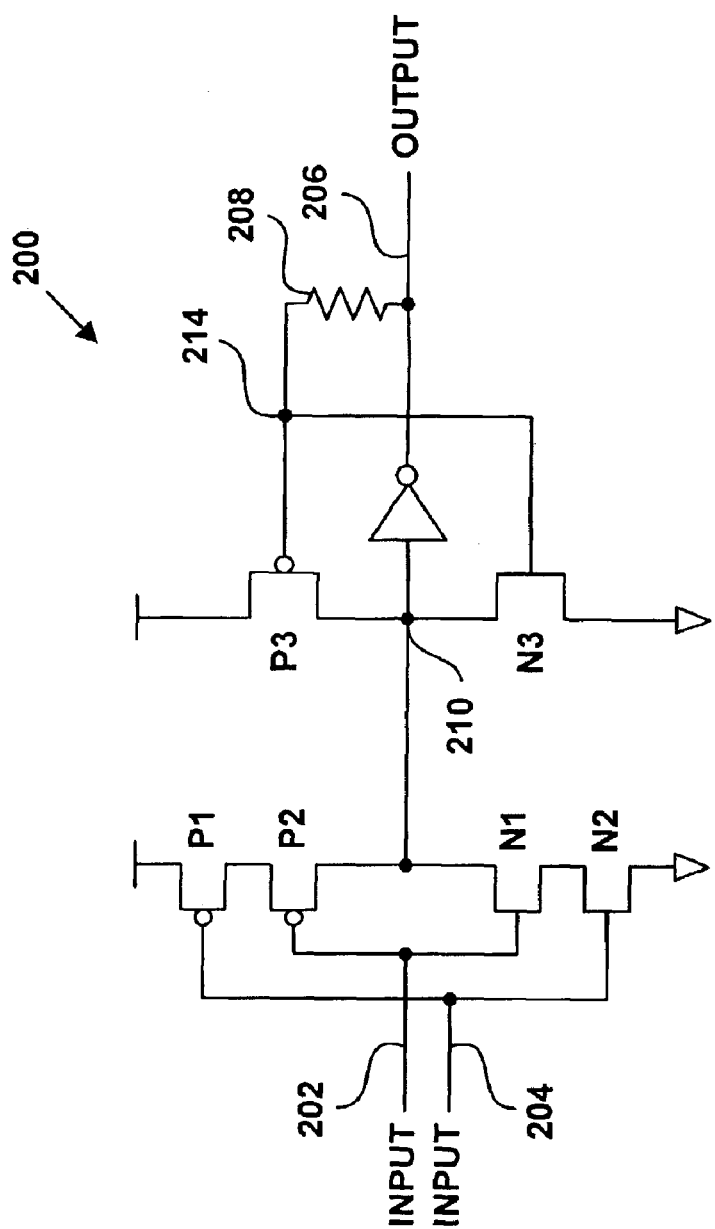
FIG. 2 is a schematic diagram of a hardened NCL circuit, according to an exemplary embodiment.

FIG. 2 is a schematic diagram of a hardened NCL circuit 200. The hardened NCL circuit 200 is similar to the NCL circuit 100, except a resistive element 208 has been added to the feedback loop. FIG. 2 depicts a semi-static feedback implementation of a hardened NCL circuit; however, adding a resistive element 208 to the feedback loop may also be beneficial for hardening NCL circuits using a static implementation.

The resistive element 208 may be connected between gates of the P3 and the N3 transistors, and the output 206. FIG. 2 depicts the resistive element 208 as a resistor; however, other resistive elements may be used. For example, the resistive element 208 may be a diode, such as a Schottky diode, a transistor, such as a junction field effect transistor (JFET), or a poly resistor.

The resistive element 208 added to the NCL circuit 100 creates a time constant. The time constant may slow feedback response time allowing transient disturbances appearing at the inputs 202, 204 or originating within the NCL circuit 200 to subside prior to being latched. The latching event may occur when the voltage on node 214 transitions to a logic level consistent with the transient disturbance. This reinforces or latches the level of the transient disturbance on node 210. If the source of the transient disturbance subsides prior to being propagated to node 214, then the transient disturbance may not be latched.

For example, assume that the correct state of node 210 is logic-1 and a transient disturbance causes node 210 to momentarily transition to a logic-0. If the transient disturbance subsides and node 210 starts to recover prior to the transient disturbance propagating to node 214, then the disturbance may not be further reinforced by transistor N3.

The selection of the resistive element 208 may be based on a value of the time constant created when the resistive element 208 is added to the NCL circuit 100. The value of the time constant should be large enough to filter transient disturbances on either the node 210 or the output 206. As a result of the filtering, the NCL circuit 200 may be hardened against SEU.

For example, in a 0.35 micron technology, the load on node 214 may be on the order of 20 femtofarads. If the selected resistive element 208 has a resistance value of 100 Kohms, the transient rejection of the NCL circuit 200 may be increased on the order of 1 to 2 nanoseconds. It will be appreciated that different resistance values may be selected to provide different hardness characteristics. Additionally, the value of the resistance might not appreciably change the speed at which a data edge propagates through the NCL circuit 200. The delay through the resistive element may increase the time to latch data, but may not significantly increase the propagation delay from the inputs 202 and 204 to the output 206.

Figure 3:
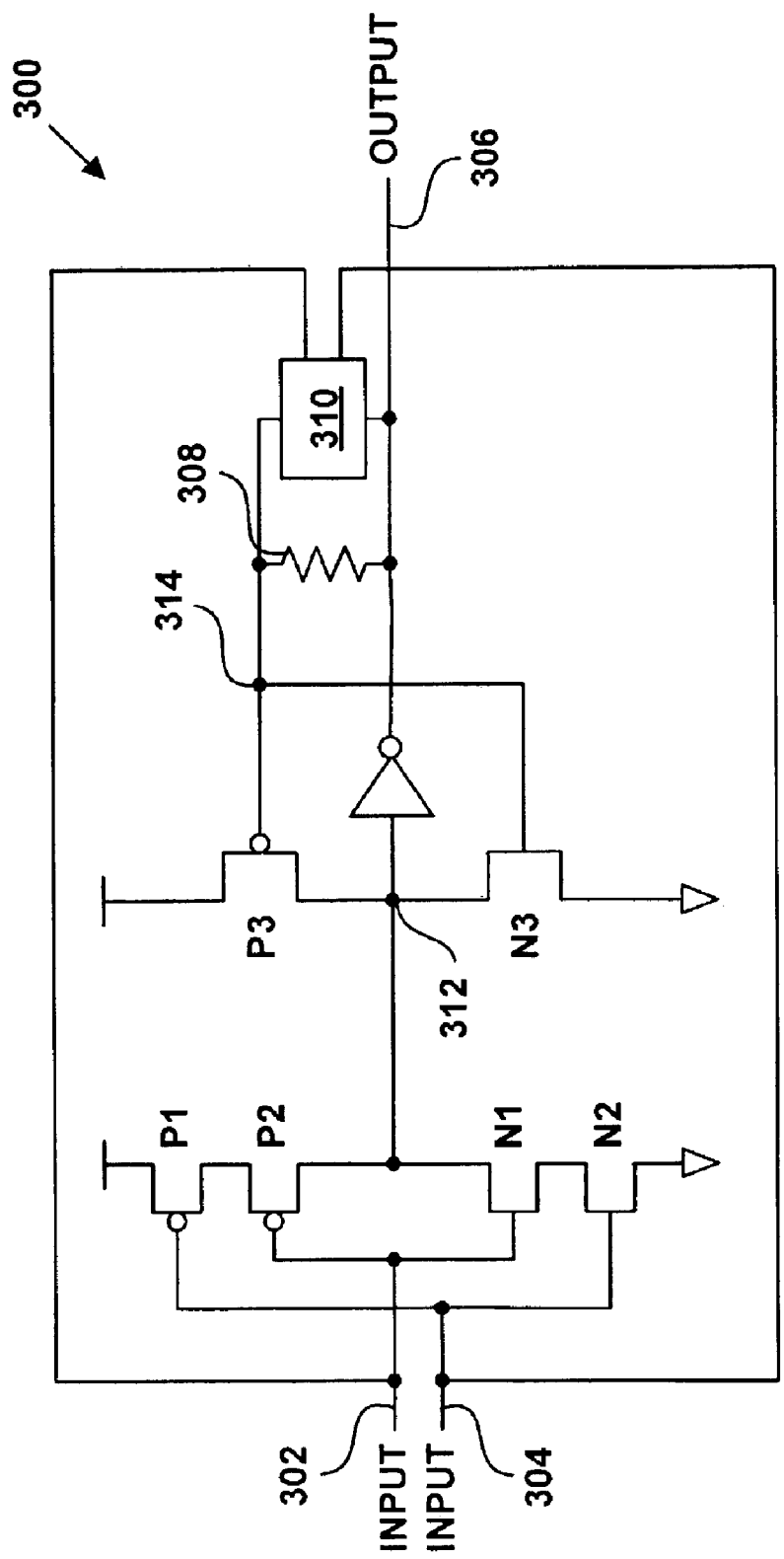
FIG. 3 is a schematic diagram of a hardened NCL circuit, according to another exemplary embodiment.

FIG. 3 is a schematic diagram of a hardened NCL circuit 300, according to another embodiment. The hardened NCL circuit 300 is similar to the hardened NCL circuit 200, except a bypass element 310 may be connected in parallel to the resistive element 308. The bypass element 310 may be used to bypass the resistive element 308 for specific combinations of inputs to the NCL circuit 300.

The bypass element 310 may speed latching when node 312 transitions to either the NULL state (e.g., logic-0 level) or the DATA state (e.g., logic-1 level). Without the bypass element 310, the state of node 312 may be unstable until node 314 reaches its final logic level, which may take several nano-seconds depending on the time constant created by the resistive element 308.

It may be beneficial for the node 314 to reach the correct logic level upon a transition to logic-0 or logic-1 before the inputs 302, 304 attempt to change states again. During the transition time between the NULL and the DATA state, the inputs 302, 304 may be in transition, resulting in the node 312 being driven only by the feedback loop transistors, P3 and N3. For example, input 302 may be at a logic-1 and input 304 may be at a logic-0. This configuration is commonly referred to as a tristate mode for the input driver comprising of N1, N2, P1, and P2. In this example, it may be beneficial for the voltage level on the node 314, which controls transistors P3 and N3, to reach the correct logic level prior to the input driver entering the tristate mode.

FIG. 4 is a schematic diagram of the bypass element 310, according to one embodiment. The bypass element 310 may short the resistive element 308 when the inputs 302, 304 are in a state to cause a transition on the output 306 (e.g., transition from DATA to NULL or NULL to DATA). The bypass element 310 may create a signal pathway that provides for quicker latching of data.

The bypass element 310 may include two inverters 402, 404 and four transistors 406, 408, 410, 412. The bypass element 310 may include other passive and/or active circuit devices. Alternatively, the bypass element 310 may include any combination of circuit devices operable to provide a bypass of the resistive element 308 when the inputs 302, 304 are in a state to cause a transition on the output 306.

The inputs 302, 304 of the hardened NCL circuit 300 may be connected to inputs of inverters 402, 404 respectively. An output of the inverter 402 may be connected to gates of a p-type transistor 406 and an n-type transistor 410, while an output of the inverter 404 may be connected to gates of a p-type transistor 408 and an n-type transistor 412. While FIG. 4 depicts the transistors as CMOS transistors, other transistor types may be used.

The p-type transistors 406, 408 may be connected in series with each other. Similarly, the n-type transistors 410, 412 may be connected in series with each other. The p-type transistors 406, 408 may be connected in parallel with the n-type transistors 410, 412.

When both inputs 302, 304 are in the DATA state, the p-type transistors 406, 408 may turn on and the n-type transistors 410, 412 may turn off. As a result, the resistive element 308 may be bypassed. Similarly, when both inputs 302, 304 are in the NULL state, the p-type transistors 406, 408 may turn off and the n-type transistors 410, 412 may turn on, which may also provide a bypass to the resistive element 308.

FIG. 5 is a schematic diagram of a semi-static implementation of a hardened NCL circuit 500, according to another embodiment. The NCL circuit 500 is similar to the NCL circuit 100 except that the input driver transistors (e.g., P1, P2, N1, and N2), the feedback transistors (e.g., P3, N3), and the transistors in the inverter 108 have been replaced with transistor stacks 508, 510. (The transistors in the inverter 108 are not depicted in FIG. 1.) The transistor stacks 508, 510 may include two or more series transistors. Transistor stack 508 may contain two or more p-type transistors connected in series, while transistor stack 510 may contain two or more n-type transistors connected in series.

FIG. 6 is a schematic diagram of a static implementation of a hardened NCL circuit 600. The input driver transistors (e.g., P1, P2, N1, and N2 depicted in FIG. 1), the feedback transistors (e.g., P3, N3 depicted in FIG. 1), and the transistors in the inverter (e.g., inverter 108 depicted in FIG. 1) have been replaced with transistor stacks 508, 510 in the NCL circuit 600 in a similar manner as the semi-static implementation of the hardened NCL circuit 500. Transistors P5, P6, N5, and N6 should not need to be replaced with the transistor stacks 508, 510, as these transistors cannot initiate a transition on node 612. Transistors P5, P6, N5, and N6 may be used to break the feedback loop if the inputs 602, 604 transition to a new state, which results in a transition on node 612. To fully protect transistors P5, P6, N5, and N6 from the effect of SEU, a body connection to source, instead of supply (Vdd and Vss), may be used as shown in FIG. 6.

FIG. 7a is a schematic diagram of a p-type transistor stack 508. FIG. 7a depicts two p-type transistors connected in series; however, more than two p-type transistors may be connected in series in transistor stack 508. FIG. 7b is a schematic diagram of an n-type transistor stack 510. FIG. 7b depicts two n-type transistors connected in series; however, more than two n-type transistors may be connected in series in transistor stack 510. FIGS. 7a and 7b depict the transistors in the transistor stacks 508, 510 as CMOS transistors; however, other transistor types may be employed.

The transistor stacks 508, 510 are depicted in FIG. 7 with terminal labels D, indicating the Drain terminal, and S, indicating the Source terminal. These terminal labels are not depicted in FIG. 5 and FIG. 6 for clarity. In a preferred embodiment, the transistor stacks 508, 510 should be connected in the NCL circuits 500, 600 in such a manner that the Source terminal is closest to the supply. Accordingly, the Source terminal in the transistor stack 508 may be closest to Vdd, while the Source terminal in the transistor stack 510 may be closest to Vss.

By using the transistor stacks 508, 510, the NCL circuit 500 and the NCL circuit 600 may be less susceptible to SEU. When radiation induced energetic particles strike a transistor, a parasitic bipolar current may flow through the transistor. The parasitic bipolar current may turn the transistor on, which may result in SEU. While an energetic particle may be able to cause SEU with a single feedback or inverter transistor, it is less likely that an energy particle could pass through two or more transistors. The energetic particle would have to turn on at least two parasitic discharge paths in transistor stacks 508, 510 to cause an SEU.

Furthermore, the transistor stacks 508, 510 may employ a body-source connection, which is in contrast to a more standard connection of PMOS body to Vdd and NMOS body to Vss. The source-body connection may prevent a discharge path from a PN junction to either Vdd or Vss, which may exist with the more standard connection of body to supply (Vdd or Vss). As a result of using transistor stacks 508, 510, the NCL circuit 500 and the NCL circuit 600 may be hardened against SEU.

FIG. 8 is a schematic diagram of a hardened NCL circuit 800, according to another exemplary embodiment. The NCL circuit 800 includes a cross-coupled pair of NCL gates. A first NCL gate has two inputs 802, 804 and an output 806. A second NCL gate has two inputs 808, 810 and an output 812. However, the NCL circuit 800 may have more than four inputs and two outputs.

In the NCL circuit 800, a data state may be represented by two electrical signals, such as outputs 806, 812. Taken together, the two electrical signals 806, 812 may represent one binary data value. In this example, the outputs of the NCL circuit 800 (e.g., 806 and 812) may be mutually exclusive. When used in a typical NCL system, at least one of the inputs to the NCL circuit 800 (e.g., 802, 804, 808, 810) may remain in the NULL state preventing all four inputs 802, 804, 808, 810 being in the DATA state at the same time. Accordingly, the NCL circuit 800 may be designed such that legal data states may include NULL (e.g., output 806=logic-0, output 812=logic-0), DATA0 (e.g., output 806=logic-0, output 812=logic-1), and DATA1 (e.g., output 806=logic-1, output 812=logic-0). The fourth possible state may be an ERROR state (e.g., output 806=logic-1, output 812=logic-1). The ERROR state may occur as a result of an SEU. After the SEU event, the NCL circuit 800 may self-recover after the transient disturbance subsides.

The output of the first NCL gate 806 may be connected to an input of a first inverter 816 and the output of the second NCL gate 812 may be connected to an input of a second inverter 814. An output of each of the inverters 814, 816 may be connected to a gate of a p-type transistor P4, P8, respectively. The p-type transistor P4 may be connected between Vdd and node 818, while the p-type transistor P8 may be connected between Vdd and node 820.

The operation of the NCL circuit 800 may be explained using an example data sequence as shown in Table 1. However, it should be understood that other data sequences might occur during the operation of the NCL circuit 800.

TABLE 1

| Input 802 | Input 804 | Input 808 | Input 810 | Output 806 | Output 812 | State |
|---|---|---|---|---|---|---|
| 0 | 0 | 0 | 0 | S0 | S0 | NULL |
| 0 | 1 | 0 | 0 | W0 | S0 | NULL |
| 0 | 1 | 1 | 0 | W0 | W0 | NULL |
| 1 | 1 | 1 | 0 | S1 | W0 | DATA1 |
| 1 | 1 | 1 | 1 | S1 | S1 | ERROR |
| 1 | 1 | 1 | 0 | S1 | W0 | RETURN TO DATA1 |

As shown in Table 1, logic levels resulting on the outputs 806, 812 in this example may include a strongly held logic-0 (S0), a strongly held logic-1 (S1), or a weakly held logic-0 (W0). The outputs 806, 812 may be described as strongly held when the output level is reinforced by the present state of the inputs 802, 804, 808, 810. The outputs 806, 812 may be described as weakly held when the output level is only maintained by the feedback loop and is not reinforced by the inputs 802, 804, 808, 810.

In this example, initially all of the inputs 802, 804, 808, and 810 may be at the logic-0 level. This may result in the NCL circuit 800 being placed in the NULL state. The outputs 806, 812 may both be at strongly held logic-0 (S0) levels as all of the pull up transistors (e.g., P1, P2, P3, P5, P6, and P7) may be turned on and all of the pull down transistors (e.g., N1, N2, N3, N4, N5, and N6) may be turned off. Additionally, transistors P4 and P8 may also be turned off.

If one of the inputs, such as the input 804, transitions to the logic-1 level, the NCL circuit 800 may remain in the NULL state. As described previously with respect to FIG. 1, transistor P3 may remain turned on, which may keep the output 806 in the NULL state. However, the output 806 may now be at a weakly held logic-0 (W0) level. Likewise, if the input 808 then transitions to the logic-1 level, transistor P7 may remain turned on, which may keep the output 812 in the NULL state. The output 812 may now be at a weakly held logic-0 level.

If the input 802 transitions to the logic-1 level, all the transistors in the pull-up network of the first NCL gate may be turned off (e.g., P1, P2, and P3), while all of the transistors in the pull-down network of the first NCL gate may be turned on (e.g., N1, N2, and N3). This may cause the output 806 to be at a strongly held logic-1 (S1) level. As a result, the output 806 may be placed in the DATA state. The output 812 may remain at the weakly held logic-0 level (NULL state) and the outputs 806 and 812 can be said to collectively represent the DATA1 state.

If the fourth input, namely the input 810, transitions to the logic-1 state, the NCL circuit 800 may be placed in an ERROR state. The NCL circuit 800 may enter the ERROR state in at least two ways. First, an SEU may have caused a transient high glitch on the input 810, resulting from an SEU on an upstream gate. Second, an SEU may have caused a transient glitch within the NCL circuit 800. For example, SEU may cause a transient low glitch on node 820. This could be a result of a particle strike on transistor N5, which could cause a parasitic discharge path to short out or bypass transistor N5. Other conditions may also cause the NCL circuit 800 to be placed in an ERROR state.

If an SEU caused the NCL circuit 800 to be placed in the ERROR state, the NCL circuit 800 may reset itself to the correct state. For example, the upstream gate that was in the NULL state prior to the glitch may return to the NULL state after the glitch subsides. In Table 1, this is illustrated by input 810 returning to a logic-0 level in the last row of the table. Subsequent to either the inputs from the upstream gate returning to a legal state or any transient disturbance within the NCL circuit 800 subsiding, the NCL circuit 800 may reset itself to the correct state based on inputs 802, 804, 808, 810.

In this example, after the glitch subsided, the inputs 802, 804 of the first NCL gate may continue to hold the output 806 in the DATA state. As a result, the output 806 may turn on transistor P8, causing node 820 to be in a logic-1 state and output 812 to be in a logic-0 state. Because the output 812 was initially in a logic-1 state, which may have turned on transistor P4, node 818 may attempt to transition to a logic-1 state. However, transistor P4 will be over written by transistors N1 and N2, which will keep node 818 in a logic-0 state. Accordingly, the series combination of N1 and N2 should have sufficiently low impedance to pull node 818 to a logic-0 level even if transistor P4 is turned on. Likewise, the series combination of N4 and N5 should be able to overdrive P8.

An illegal input to a pair of NCL gates as shown in FIG. 8 or a transient disturbance within an NCL circuit 800 may cause a transition to an ERROR state. After the transient disturbance or illegal input subsides, both outputs may remain in the logic-1 state. The gate whose logic-1 output state is reinforced by its inputs will overwrite the other gate whose output is not legal and is not reinforced by its inputs, causing the second gate to return to the logic-0 state. Accordingly, the use of a cross-coupled pair of NCL gates may harden the NCL circuit 800 against SEU.

It should be understood that the illustrated embodiments are exemplary only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A system for hardening an asynchronous logic circuit against single event upset, comprising in combination:
    an asynchronous logic circuit including a feedback loop; and
    a resistive element connected between an output of the asynchronous logic circuit and a gate of a transistor in the feedback loop, wherein the resistive element is operable to create a time constant, wherein the time constant slows feedback response of the feedback loop, thereby allowing transient disturbances to subside prior to being latched by the asynchronous logic circuit.

2. The system of claim 1, wherein the asynchronous logic circuit is a null convention logic circuit.

3. The system of claim 1, wherein the resistive element is a circuit device selected from the group consisting of resistors, diodes, and transistors.

4. The system of claim 1, further comprising a bypass element operable to short the resistive element when an input to the asynchronous logic circuit causes the output of the asynchronous logic circuit to transition from one logic level to another logic level.

5. The system of claim 4, wherein the bypass element decrease time needed to latch a signal into the asynchronous logic circuit.

6. A method for hardening an asynchronous logic circuit against single event upset, comprising connecting a resistive element between an output of the asynchronous logic circuit and a gate of a transistor in a feedback loop of the asynchronous logic circuit, wherein the resistive element creates a time constant operable to slow feedback response of the feedback loop, thereby allowing transient disturbances to subside prior to being latched by the asynchronous logic circuit.

7. The method of claim 6, wherein the asynchronous logic circuit is a null convention logic circuit.

8. The method of claim 6, wherein the resistive element is a circuit device selected from the group consisting of resistors, diodes, and transistors.

9. The method of claim 6, further comprising a bypass element in parallel to the resistive element, wherein the bypass element is operable to short the resistive element when an input to the asynchronous logic circuit causes the output of the asynchronous logic circuit to transition from one logic level to another logic level.

10. The method of claim 9, wherein the bypass element decreases time needed to latch a signal into the asynchronous logic circuit.

11. A system for hardening an asynchronous logic circuit against single event upset, comprising in combination:
an input driver far receiving inputs to the asynchronous logic circuit;
a feedback loop;
an inverter located within the feedback loop; and
at least one transistor stack located in at least one of the input driver, the feedback loop, and the inverter, wherein the at least one transistor stack includes at least two transistors connected in series, wherein the at least two transistors have a same transistor type, wherein gates of the at least two transistors are connected, and wherein the at least one transistor stack is operable to prevent energetic particles from turning on all transistors in the at least one transistor stack, thereby hardening the asynchronous logic circuit from single event upset.

12. The system of claim 11, wherein the asynchronous logic circuit is a null convention logic circuit.

13. The system of claim 11, wherein a body terminal of each series transistor is connected to a transistor source.

14. A method for hardening on asynchronous logic circuit against single event upset, comprising placing at least one transistor stack in at least one of an input driver, a feedback loop, and an inverter in the asynchronous logic circuit, wherein the at least one transistor stack includes at least two transistors having a same transistor type connected in series, wherein the at least two transistors have a same transistor type, wherein gates of the at least two transistors are connected, and wherein the at least one transistor stack is operable to prevent energetic particles from turning on all transistors in the at least one transistor stack.

15. The method of claim 14, wherein the asynchronous logic circuit is a null convention logic circuit.

16. The method of claim 14, wherein a body terminal of each series transistor is connected to a transistor source.

17. A system for hardening an asynchronous logic circuit against single event upset, comprising in combination:
a first asynchronous logic gate; and
a second asynchronous logic gate, wherein an output of the first asynchronous logic gate is connected to an input of a feedback loop in the second asynchronous logic gate and an output of the second asynchronous logic gate is connected to an input of a feedback loop in the first asynchronous logic gate, wherein the asynchronous circuit is operable to reset itself to a correct state after entering an error state.

18. The system of claim 17, wherein the asynchronous logic circuit is a null convention logic circuit.

19. The system of claim 17, wherein the output of the first asynchronous logic gate is connected to the second asynchronous logic gate through an inverter and a transistor.

20. The system of claim 17, wherein the output of the second asynchronous logic gate is connected to the first asynchronous logic gate through an inverter and a transistor.

21. The system at claim 17, wherein the single event upset cause the asynchronous logic circuit to enter the error state.

22. A method for hardening an asynchronous logic circuit against single event upset, comprising in combination:
connecting an output of a first asynchronous logic gate to an input of a feedback loop in a second asynchronous logic gate; and
connecting an output of the second asynchronous logic gate to an input of a feedback loop in the first asynchronous logic gate, wherein if the output of the first asynchronous logic gate and the output of the second asynchronous logic gate are at a level representing DATA then the asynchronous logic circuit enters an error state, wherein the asynchronous logic circuit resets itself to a correct state after entering the error state.

23. The method of claim 22, wherein the asynchronous logic circuit is a null convention logic circuit.

24. The method of claim 22, wherein the output of the first asynchronous logic gate is connected to the second asynchronous logic gate through an inverter and a transistor.

25. The method of claim 22, wherein the output of the second asynchronous logic gate is connected to the first asynchronous logic gate through an inverter and a transistor.

26. The method of claim 20, wherein the single event upset causes the asynchronous logic circuit to enter the error state.

* * * * *

UNITED STATES PATENT AND TRADEMARK OFFICE
CERTIFICATE OF CORRECTION

PATENT NO. : 6,937,053 B2
DATED : August 30, 2005
INVENTOR(S) : Carlson et al.

It is certified that error appears in the above-identified patent and that said Letters Patent is hereby corrected as shown below:

Column 9,
Line 14, delete "decrease" and substitute -- decreases --.
Line 30, between "comprising" and "a" insert -- connecting --.
Line 41, delete "far" and substitute -- for --.

Column 10,
Line 33, delete "at" and substitute -- of --.
Line 57, delete "20" and substitute -- 22 --.

Signed and Sealed this

Sixteenth Day of May, 2006

JON W. DUDAS
*Director of the United States Patent and Trademark Office*